(12) United States Patent
Meiser et al.

(10) Patent No.: US 10,546,920 B2
(45) Date of Patent: Jan. 28, 2020

(54) SEMICONDUCTOR DEVICE HAVING A BURIED LAYER

(71) Applicant: Infineon Technologies AG, Neubiberg (DE)

(72) Inventors: Andreas Meiser, Sauerlach (DE); Ralf Rudolf, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/902,158

(22) Filed: Feb. 22, 2018

(65) Prior Publication Data

US 2018/0240868 A1    Aug. 23, 2018

(30) Foreign Application Priority Data

Feb. 23, 2017   (DE) .................. 10 2017 103 782

(51) Int. Cl.
  *H01L 29/06*  (2006.01)
  *H01L 21/265* (2006.01)
  *H01L 21/74*  (2006.01)
  *H01L 21/761* (2006.01)
  *H01L 29/10*  (2006.01)

(52) U.S. Cl.
  CPC .... *H01L 29/0623* (2013.01); *H01L 21/26513* (2013.01); *H01L 21/743* (2013.01); *H01L 21/761* (2013.01); *H01L 29/1087* (2013.01)

(58) Field of Classification Search
  CPC . H01L 29/0623; H01L 21/763; H01L 21/761; H01L 21/743; H01L 21/26513; H01L 21/823892; H01L 21/823878; H01L 27/0922; H01L 29/1087
  See application file for complete search history.

(56) References Cited

U.S. PATENT DOCUMENTS

| 4,729,964 A | * | 3/1988 | Natsuaki | H01L 21/26513 438/220 |
| 5,132,235 A | * | 7/1992 | Williams | H01L 21/74 148/DIG. 85 |
| 5,495,124 A | * | 2/1996 | Terashima | H01L 21/74 257/369 |
| 7,982,284 B2 | | 7/2011 | Meiser et al. | |
| 2011/0309441 A1 | * | 12/2011 | Stecher | H01L 21/187 257/338 |
| 2015/0179734 A1 | | 6/2015 | Guowei et al. | |
| 2015/0311281 A1 | * | 10/2015 | Pendharkar | H01L 21/2652 257/487 |

* cited by examiner

*Primary Examiner* — Marcos D. Pizarro
*Assistant Examiner* — Sue Tang
(74) *Attorney, Agent, or Firm* — Murphy, Bilak & Homiller, PLLC

(57) ABSTRACT

A semiconductor device includes a semiconductor substrate of a first conductivity type. A first semiconductor layer of a second conductivity type is on the semiconductor substrate. A buried semiconductor layer of the second conductivity type is on the first semiconductor layer. A second semiconductor layer of the second conductivity type is on the buried semiconductor layer. A trench extends through each of the second semiconductor layer, the buried semiconductor layer, and the first semiconductor layer, and into the semiconductor substrate. An insulating structure lines walls of the trench. A conductive filling in the trench is electrically coupled to the semiconductor substrate at a bottom of the trench.

17 Claims, 7 Drawing Sheets

SEMICONDUCTOR DEVICE HAVING A BURIED LAYER

BACKGROUND

In a variety of semiconductor power applications, chip diagnostic functions and protection circuits are required, for example in power drivers for automotive and industrial applications such as protected low side, high side and bridge configurations or complete power system integrated circuits (ICs). Power devices and analog and digital circuits may be combined by monolithic integration in a single chip in so-called "Smart Power" or "BCD" (Bipolar CMOS DMOS) technologies. Smart Power technologies may be classified with respect to isolation technique, for example self-isolation, junction isolation, or dielectric isolation, or with respect to a type of the power device, for example specification of a direction of current flow.

Electric isolation of neighboring circuit elements, for example bipolar junction transistors (BJTs) or field effect transistors (FETs) is required to allow each of the circuit elements to be operated in the specified operational voltage range, thereby avoiding the risk of electric breakdown of circuit elements within the specified operational voltage range, for example. Hence, it is desirable to improve electric isolation techniques of semiconductor devices.

SUMMARY

The present disclosure relates to a semiconductor device comprising a semiconductor substrate of a first conductivity type. A first semiconductor layer of a second conductivity type is on the semiconductor substrate. A buried semiconductor layer of the second conductivity type is on the first semiconductor layer. A second semiconductor layer of the second conductivity type is on the buried semiconductor layer. A trench extends through each of the second semiconductor layer, the buried semiconductor layer, and the first semiconductor layer into the semiconductor substrate. An insulating structure lines walls of the trench. A conductive filling is in the trench and electrically coupled to the semiconductor substrate at a bottom of the trench.

The present disclosure also relates to a method of manufacturing a semiconductor device. The method comprises forming a first semiconductor layer of a second conductivity type on a semiconductor substrate of a first conductivity type. The method further comprises implanting dopants of the second conductivity type into first semiconductor layer. The method further comprises forming a second semiconductor layer of the second conductivity type on the first semiconductor layer, wherein the implanted dopants constitute a buried semiconductor layer arranged between the first and second semiconductor layers. The method further comprises forming a trench extending through the second semiconductor layer, through the buried semiconductor layer, through the first semiconductor layer, and into the semiconductor substrate. The method further comprises forming an insulating structure lining walls of the trench, and forming a conductive filling in the trench electrically coupled to the semiconductor substrate at a bottom of the trench.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments and together with the description serve to explain principles of the invention. Other embodiments of the invention and intended advantages will be readily appreciated as they become better understood by reference to the following detailed description.

DETAILED DESCRIPTION

Figure 1:
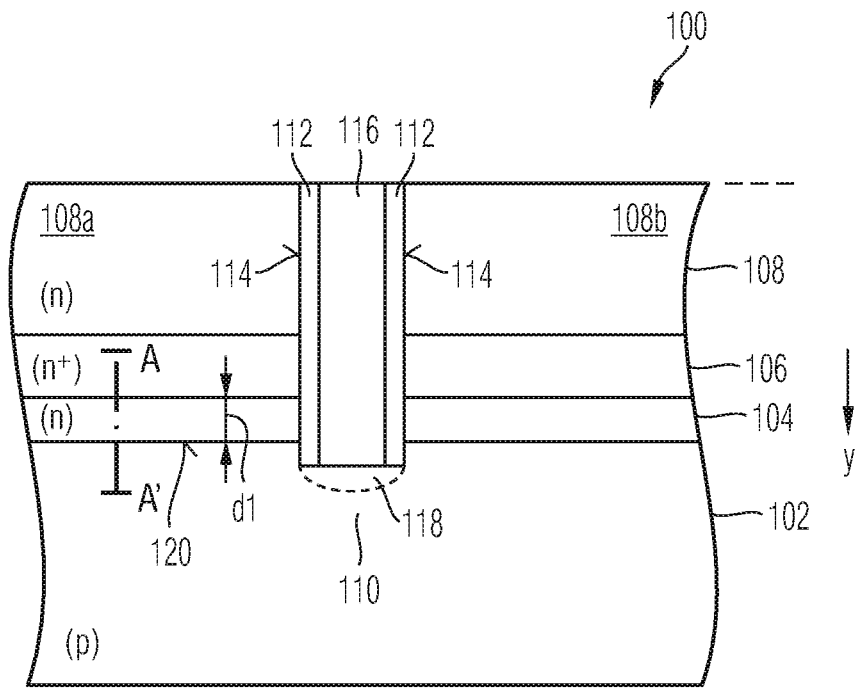
FIG. 1 is a schematic cross-sectional view of a semiconductor body portion 100 for illustrating a semiconductor device comprising a trench isolation and substrate contact structure.

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another In this specification, p-doped is referred to as first conductivity type while n-doped is referred to as second conductivity type. Alternatively, the semiconductor devices can be formed with opposite doping relations so that the first conductivity type can be n-doped and the second conductivity type can be p-doped.

FIG. 1 is a schematic cross-sectional view of a semiconductor body portion 100 for illustrating one or more embodiments.

An n-doped first semiconductor layer 104 is on a p-doped semiconductor substrate 102. An $n^+$-doped buried semiconductor layer 106 is on the first semiconductor layer. An n-doped second semiconductor layer 108 is on the $n^+$-doped buried semiconductor layer 106. A trench 110 extends through each of the n-doped second semiconductor layer 108, the $n^+$-doped buried semiconductor layer 106, and the n-doped first semiconductor layer 104 into the p-doped semiconductor substrate 102. An insulating structure 112 lines walls 114 of the trench 110. A conductive filling 116 is in the trench. The conductive filling 116 is electrically coupled to the p-doped semiconductor substrate 102 at a bottom of the trench 110.

The p-doped semiconductor substrate 102 may be $p^+$-doped. Exemplary doping concentrations of the $p^+$-doped semiconductor substrate 102 may exceed $10^{18}$ cm$^{-3}$, or $5 \times 10^{18}$ cm$^{-3}$, or $10^{19}$ cm$^{-3}$, for example. This may allow for suppressing or deteriorating a parasitic substrate npn transistor formed between n-doped sections 108a, 108b of the n-doped second semiconductor layer 108 adjoining opposite sidewalls of the trench 110, for example. A highly p-doped semiconductor substrate may also promote an electric contact between the semiconductor substrate and the conductive filling 116. By way of example, a highly p-doped semiconductor substrate may supersede an optional contact promotion layer 118, for example at highly p-doped layer or a silicide at the bottom of the trench 110, for example. In some other embodiments, the p-doped semiconductor substrate 102 may have a low or moderate p-doping, for example doping concentrations smaller than $10^{16}$ cm$^{-3}$, or smaller than $10^{15}$ cm$^{-3}$, or even smaller than $10^{14}$ cm$^{-3}$. This may allow for increasing a voltage blocking capability of the substrate breakdown voltage by utilizing part of the low or moderate p-doping of the semiconductor substrate for absorption of part of a reverse blocking voltage. In some other embodiments, the p-doped semiconductor substrate may include a highly doped, i.e. $p^+$-doped first semiconductor substrate part and a low or moderately p-doped second semiconductor substrate part on the first semiconductor substrate part for combining benefits of high and moderate/low doping of the semiconductor substrate as described above.

In one or more embodiments, a vertical distance between a maximum of the doping concentration profile of the $n^+$-doped buried semiconductor layer 106 and a pn junction 120 between the n-doped first semiconductor layer 104 and the p-doped semiconductor substrate 102 is in a range from 10 µm to 30 µm. This may allow for setting a desired substrate breakdown voltage of circuit elements formed in the n-doped sections 108a, 108b of the n-doped second semiconductor layer 108, for example.

In one or more embodiments, a doping concentration profile of the n-doped first semiconductor layer 104 in a depth direction into the p-doped semiconductor substrate 102, for example along a vertical direction y is an in-situ doped concentration profile. Other than characteristic diffusion-broadened ion implantation doping profiles that may be similar to or approximated by diffusion-broadened Gaussian-like depth profiles, in-situ doping allows for setting of a vast variety of doping profiles other than diffusion-broadened Gaussian-like depth profiles, such as, for example constant, step-like, constantly increasing or constantly decreasing doping concentration profiles that may be beneficial for setting a desired substrate breakdown voltage of circuit elements formed in the n-doped sections 108a, 108b of the n-doped second semiconductor layer 108, for example.

In one or more embodiments, a dose of doping of the n-doped first semiconductor layer 104 along a vertical extension dl of the n-doped first semiconductor layer 104 from a transition to the $n^+$-doped buried semiconductor layer 106 to the pn junction 120 between the n-doped first semiconductor layer 104 and the p-doped semiconductor substrate 102 is in a range from $10^{11}$ cm$^{-2}$ to $10^3$ cm$^{-2}$. The dose of doping may be determined by integrating n-type dopants along the vertical extension, for example. In one or more embodiments, the dose of doping may be adjusted to set a breakdown voltage of the pn junction 120 between the n-doped first semiconductor layer 104 and the p-doped semiconductor substrate 102 in a range from 120V to 200V. This may allow for coping with increasing electrical power demands in modern cars involving a 48 V board net. This voltage level requires power semiconductors, for example electric turbo loaders with higher voltage rating compared to the 12 V board net.

In one or more embodiments, a doping concentration profile of the $n^+$-doped buried semiconductor layer 106 in a depth direction into the p-doped semiconductor substrate 102 is determined by an ion implantation profile. The ion implantation profile may include one or multiple overlapping and diffusion-broadened Gaussian-like depth profiles including a peak or maximum doping concentration. The maximum doping concentration of the buried semiconductor layer may be in a range from $5 \times 10^{18}$ cm$^{-3}$ and $5 \times 10^{20}$ cm$^{-3}$, for example. In one or more embodiments, the $n^+$-doped buried semiconductor layer includes more than one dopant species, for example phosphorus and arsenic dopants. When combining arsenic dopants and phosphorus dopants, arsenic dopants may allow for achieving large peak concentrations which may be beneficial for transverse conductivity and suppression or deterioration of a parasitic substrate pnp transistor while phosphorus dopants may allow for achieving a softer outdiffusion profile towards the p-doped semiconductor substrate 102 which may be beneficial for increasing the breakdown voltage of the pn junction 120 between the n-doped first semiconductor layer 104 and the p-doped semiconductor substrate 102, for example.

In one or more embodiments, the doping concentration profile includes a kink point at a boundary between the n+-doped buried semiconductor layer 106 and the n-doped first semiconductor layer 104. The vertical extension of the first semiconductor layer d between the kink point and the pn junction 120 between the n-doped first semiconductor layer 104 and the p-doped semiconductor substrate 102 may be set in a range from 5 μm to 25 μm. This may allow for adjusting the breakdown voltage of the pn junction 120 between the n-doped first semiconductor layer 104 and the p-doped semiconductor substrate 102 in the range as specified above based on doping concentrations in a range from $10^{14}$ cm$^{-3}$ to $5 \times 10^{16}$ cm$^{-3}$, or from $5 \times 10^{14}$ cm$^{-3}$ to $1 \times 10^{16}$ cm$^{-3}$, for example. The kink point at the boundary between the n+-doped buried semiconductor layer 106 and the n-doped first semiconductor layer 104 may be caused by overlap of doping concentration profiles of the ion implantation profile of the dopants of the n+-doped buried semiconductor layer and the dopants of the doping concentration profile of the in-situ n-doped first semiconductor layer 104, for example.

In one or more embodiments, a doping concentration profile of p-type dopants of the p-doped semiconductor substrate 102 decreases along a vertical direction from the p-doped semiconductor substrate 102 toward the n+-doped buried semiconductor layer 106. This may be caused by the thermal budget during processing of the semiconductor device, for example a thermal budget caused by annealing process(es), oxidation process(es), or layer deposition process(es), for example. A p-type doping concentration of the dopants of the p-doped semiconductor substrate 102 at a depth of the maximum doping concentration of the buried semiconductor layer may be smaller than $10^{14}$ cm$^{-3}$. In one or more embodiments, outdiffusion of dopants of the p-doped semiconductor substrate 102 may even end before the maximum of the n+-doped buried semiconductor layer 106, for example within the n-doped first semiconductor layer 104. Provision of the n-doped first semiconductor layer 104 thus has an impact on an offset between doping concentration profiles of the n+-doped buried semiconductor layer 106 and the p-doped semiconductor substrate 102. While ion implantation of dopants for the buried semiconductor layer into the p-doped semiconductor substrate may position a peak or maximum doping concentration of the n+-doped buried semiconductor layer into a part of the semiconductor substrate where the p-type doping of the semiconductor substrate is turned into an n-type doping of the buried layer by counter-doping, ion implantation of dopants for the buried semiconductor layer into the first semiconductor layer may position a peak or maximum doping concentration of the n+-doped buried semiconductor layer into a part of the first semiconductor layer that is spaced apart from or slightly overlapping with an end of a diffusion profile tail of dopants from the semiconductor substrate.

In one or more embodiments, a doping concentration of the n-doped first semiconductor layer 104 is constant along at least 50% of the vertical extension d of the n-doped first semiconductor layer 104 from the transition to the n+-doped buried semiconductor layer 106 to the pn junction 120 between the n-doped first semiconductor layer 104 and the p-doped semiconductor substrate 102. In one or more embodiments, a doping concentration profile of the n-doped first semiconductor layer 104 along the vertical direction y includes at least two plateaus, for example two or three plateaus. This may allow for further increasing the breakdown voltage of the pn junction 120 between the n-doped first semiconductor layer 104 and the p-doped semiconductor substrate 102. In one or more embodiments, a first plateau of the n-doped first semiconductor layer 104 is set closer to the p-doped semiconductor substrate 102 than a second plateau of the n-doped first semiconductor layer 104, and a doping concentration at the first plateau is set smaller than a doping concentration at the second plateau.

In one or more embodiments, the insulating structure 112 lining walls 114 of the trench 110 may include one or multiple stacked insulating materials, for example one or a combination of oxides such $SiO_2$ as thermal oxide, oxides deposited by chemical vapor deposition (CVD) processes such as low-pressure (LP) CVD oxides, for example borophosphosilicate glass (BPSG), phosphosilicate glass (PSG), borosilicate glass (BSG), nitride(s), low- and high-dielectrics, and any combination of these or other insulating materials.

In one or more embodiments, the semiconductor body portion 100 comprises a plurality of the trenches 110 and a plurality of semiconductor circuit elements formed in different sections of the n-doped second semiconductor layer 108, for example in the n-doped sections 108a, 108b. The plurality of trenches is configured to electrically isolate neighboring sections of the second semiconductor layer that are separated by one of the plurality of trenches, for example the trench 110 illustrated in FIG. 1 electrically isolating the n-doped sections 108a, 108b. The circuit elements may include a combination of bipolar circuit elements, for example lateral or vertical npn and pnp transistor, medium voltage (MV) and high voltage (HV) field effect transistors (FETs) such as n-channel or p-channel metal oxide semiconductor FETs (MV and HV-MOSFETs), complementary MOS (CMOS) circuit elements, for example n-channel and p-channel LV-MOSFETs, and double-diffused MOS (DMOS) circuit elements, for example lateral and vertical DMOS transistors, diodes, passive components such as resistors, capacitors, for example.

Figure 2A:
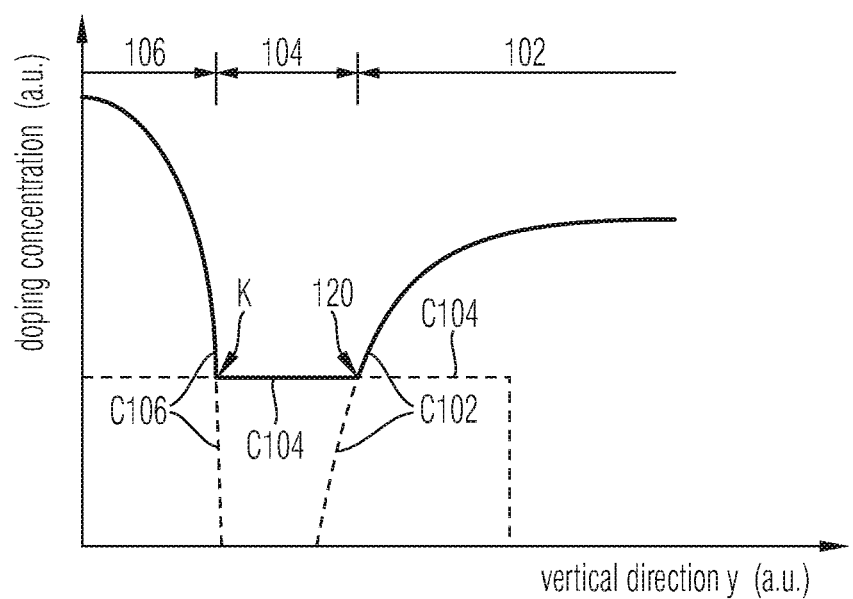
FIGS. 2A to 2E are graphs for illustrating various doping concentration profiles along line A-A' of FIG. 1.

The schematic graph of FIG. 2A illustrates one example of a doping concentration profile along line A-A' of FIG. 1.

A doping concentration profile c106 of n-type dopants of the n+-doped buried semiconductor layer 106 turns into a constant doping concentration profile c104 of n-type dopants of the n-doped first semiconductor layer 104 at a kink point K. The n-doped first semiconductor layer 104 extends along the vertical direction y up to the pn junction 120 between the n-doped first semiconductor layer 104 and the p-doped semiconductor substrate 102. A doping concentration profile of p-type dopants of the p-doped semiconductor substrate 102 is denoted by c102. The vertical extension of the n-doped first semiconductor layer 104 illustrated in FIG. 2 is smaller than an initial thickness after layer growth due to diffusion of dopants from the p-doped semiconductor substrate 102 into the n-doped first semiconductor layer 104 and due to ion implantation of dopants for fabricating the n+-doped buried semiconductor layer 106. This may lead to shrinking of the n-doped first semiconductor layer 104. At the knee point K, a number of n-type dopants of the n+-doped buried semiconductor layer 106 switches from being larger than a number of n-type dopants of the n-doped first semiconductor layer 104 to being smaller than a number of n-type dopants of the n-doped first semiconductor layer 104, i.e. c106>c104 holds in the n+-doped buried semiconductor layer and c106<c104 holds in the n-doped first semiconductor layer 104. Likewise, at the pn junction 120, a number of n-type dopants of the n-doped first semiconductor layer 104 switches from being larger than a number of p-type dopants of the p-doped semiconductor substrate 102 to being smaller than a number of p-type dopants of the p-doped semiconductor substrate 102, i.e. c104>c102 holds in the n-doped first semiconductor layer 104 and c104<c102 holds in the p-doped semiconductor substrate 102.

The graph illustrated in FIG. 2A is one example of a doping concentration profile along the line A-A' of FIG. 1. Some other examples are illustrated in FIGS. 2B to 2E.

Figure 2B:
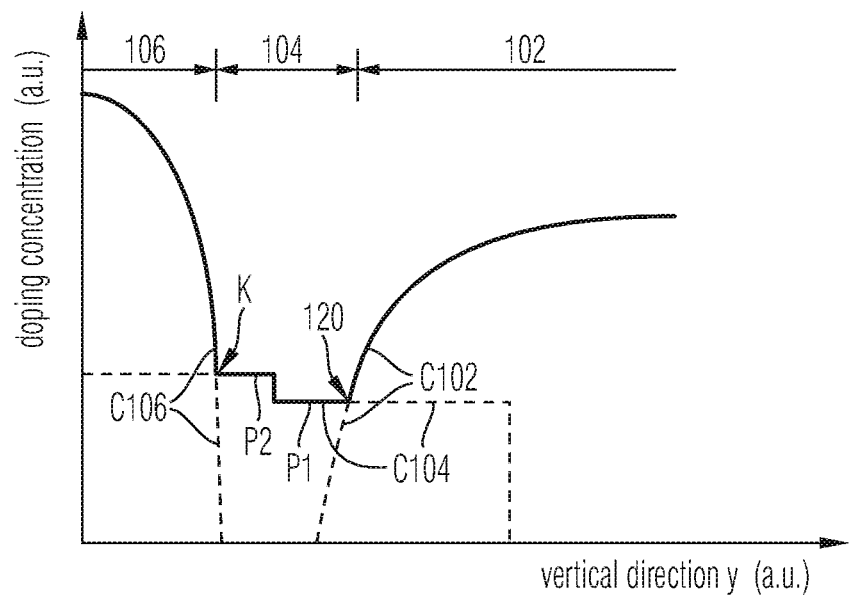

Referring to the graph illustrated in FIG. 2B, the doping concentration profile c104 of the n-doped first semiconductor layer 104 along the vertical direction y includes at two plateaus P1, P2. The first plateau P1 of the n-doped first semiconductor layer 104 is set closer to the p-doped semiconductor substrate 102 than the second plateau P2 of the n-doped first semiconductor layer 104, and a doping concentration at the first plateau P1 is set smaller than a doping concentration at the second plateau P2, thereby allowing for further increase of the breakdown voltage of the pn junction 120 between the n-doped first semiconductor layer 104 and the p-doped semiconductor substrate 102.

Figure 2C:
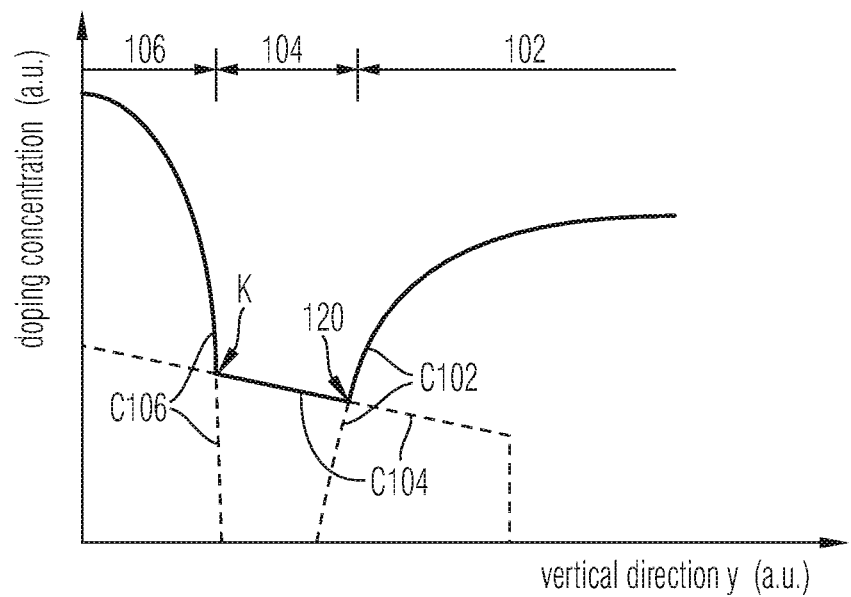

Referring to the graph illustrated in FIG. 2C, the doping concentration profile c104 of the n-doped first semiconductor layer 104 along the vertical direction y is constantly decreasing from the kink point K toward the pn junction 120, thereby allowing for further increase of the breakdown voltage of the pn junction 120 between the n-doped first semiconductor layer 104 and the p-doped semiconductor substrate 102.

Figure 2D:
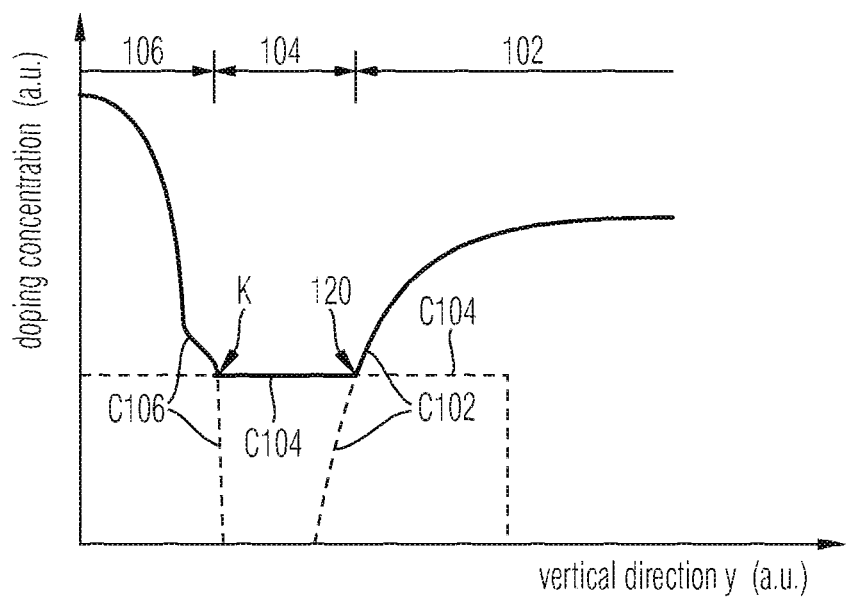

Referring to the graph illustrated in FIG. 2D, the doping concentration profile c106 of the $n^+$-doped buried semiconductor layer 106 is a superposition of two diffusion-broadened profiles, for example an arsenic dopant profile determining a peak concentration which may be beneficial for transverse conductivity and suppression or deterioration of a substrate pnp transistor and a phosphorus dopant profile determining a tail of the profile that may allow for achieving a softer outdiffusion profile towards the p-doped semiconductor substrate 102 which may be beneficial for increasing the breakdown voltage of the pn junction 120 between the n-doped first semiconductor layer 104 and the p-doped semiconductor substrate 102, for example.

Figure 2E:
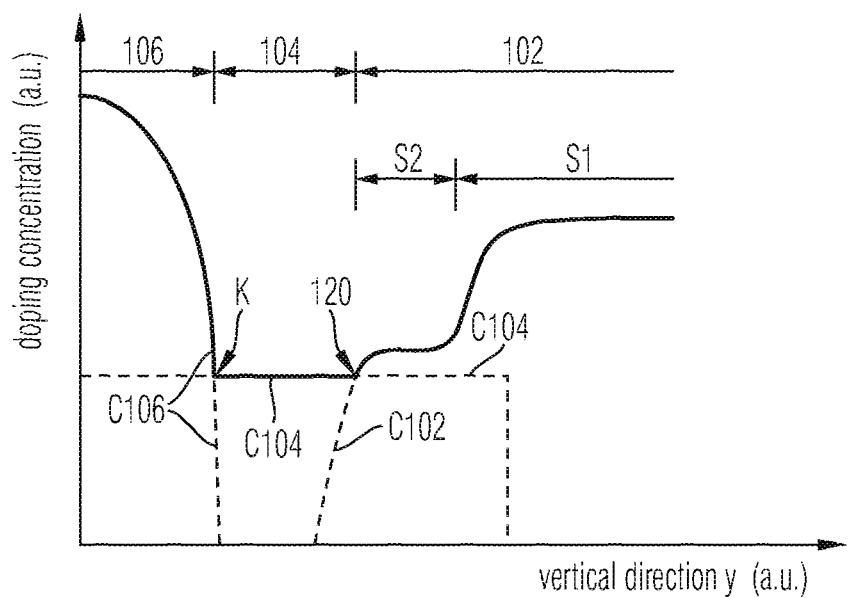

Referring to the graph illustrated in FIG. 2E, the doping concentration profile c102 of the p-doped semiconductor substrate may include a highly doped, i.e. $p^+$-doped first semiconductor substrate part S1 and a low or moderately p-doped second semiconductor substrate part S2 on the first semiconductor substrate part for combining benefits of high and moderate/low doping of the semiconductor substrate 102 as described with reference to FIG. 1.

Further examples may be based on a combination of any of the profiles c106, c104, 102 illustrated in FIGS. 2A to 2D, for example.

Figure 3:
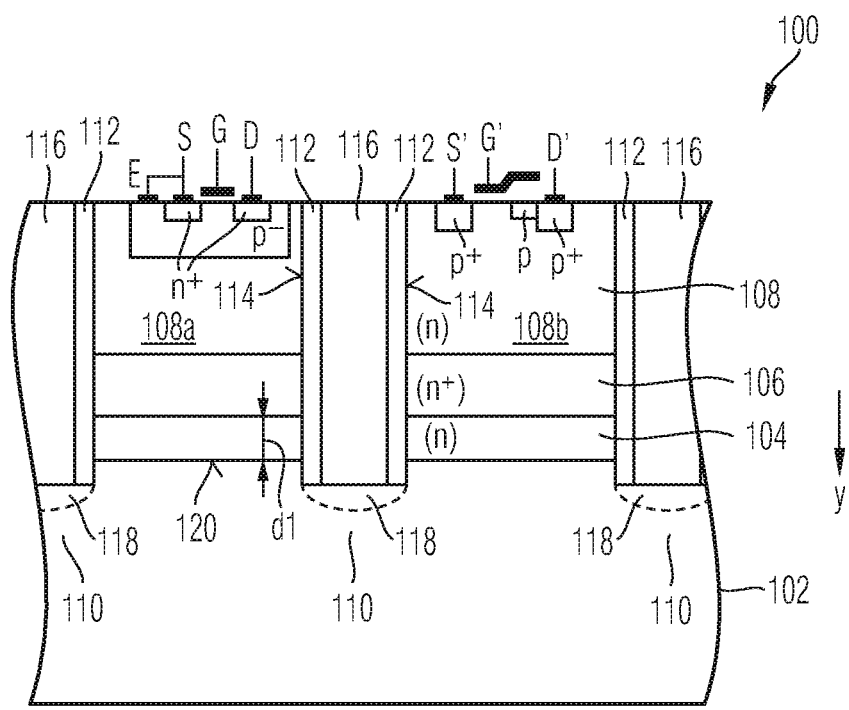
FIG. 3 is a schematic cross-sectional view of a semiconductor body portion 100 for illustrating circuit elements electrically insulated by a trench isolation and substrate contact structure.

The semiconductor body portion 100 illustrated in FIG. 3 comprises a plurality of the trenches 110 and a plurality of semiconductor circuit elements formed in different sections of the n-doped second semiconductor layer 108, for example a LV n-channel MOSFET (LV NMOSFET) comprising body (B), source (S), drain (D) and gate (G) in the first n-doped section 108a, and a high voltage (HV) p-channel MOSFET (HV PMOSFET) comprising source (S'), drain (D') and gate (G') in the second n-doped section 108b. The circuit elements illustrated in the first and second n-doped sections 108a, 108b are exemplary circuit elements for illustration purposes. Other or additional circuit elements may be included such as bipolar circuit elements, for example lateral or vertical npn and pnp transistor, medium voltage (MV) and high voltage (HV) field effect transistors (FETs) such as n-channel and p-channel metal oxide semiconductor FETs (MV and HV-NMOSFETs or PMOSFETs), complementary MOS (CMOS) circuit elements, for example n-channel and p-channel LV-MOSFETs, and double-diffused MOS (DMOS) circuit elements, for example lateral and vertical DMOS transistors, diodes, passive components such as resistors, capacitors, for example.

FIGS. 4A to 4F are schematic cross-sectional views of a semiconductor body portion 200 for illustrating a method of manufacturing a semiconductor device.

Figure 4A:
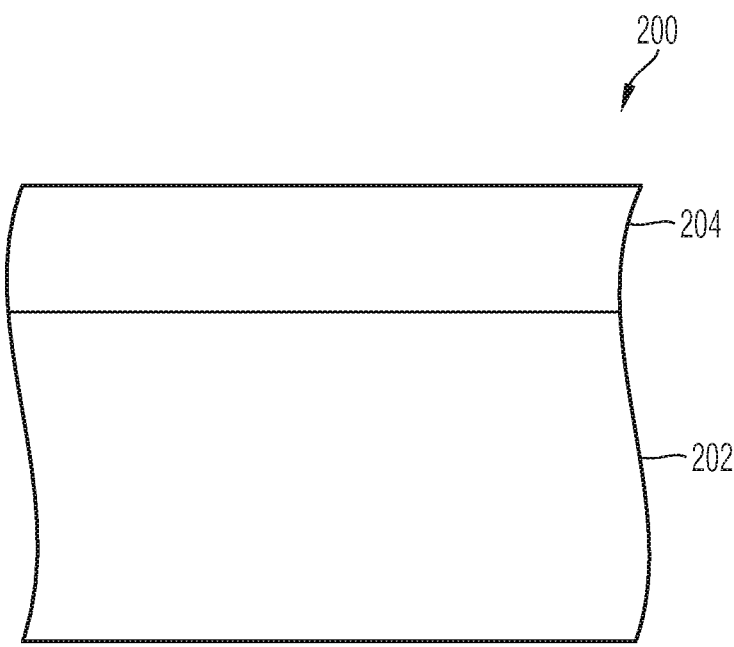
FIGS. 4A to 4F are schematic cross-sectional views for illustrating a process flow for manufacturing a semiconductor device comprising a trench isolation and substrate contact structure.

Referring to the schematic cross-sectional view of FIG. 4A, a first semiconductor layer 204 of a second conductivity type, for example n-type is formed on a semiconductor substrate 202 of a first conductivity type, for example p-type. The first semiconductor layer 204 may be formed by a layer deposition process, for example CVD such as LPCVD or APCVD of silicon on a silicon substrate. The first semiconductor layer 204 may be doped in-situ. Details provided with regard to parameters of the p-doped semiconductor substrate 102 described above with reference to FIGS. 1 to 3, for example doping concentration values and profiles, and details provided with regard to parameters of the n-doped first semiconductor layer 104 described above with reference to FIGS. 1 to 3 apply likewise with respect to the embodiment illustrated in FIGS. 4A to 4F.

Figure 4B:
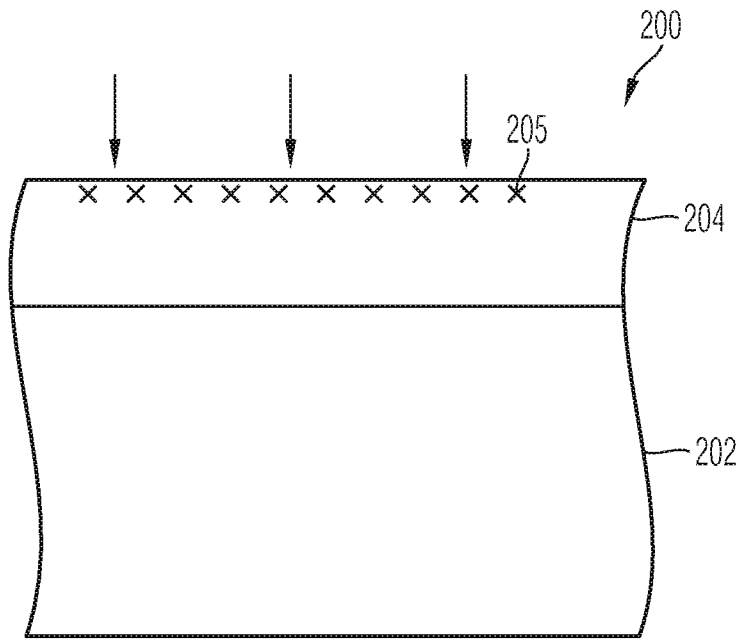

Referring to the schematic cross-sectional view of FIG. 4B, dopants 205 of the second conductivity type are implanted into first semiconductor layer 204. The dopants may include one or more dopant species, for example one or more of arsenic, phosphorus, antimony. The dopants of the second conductivity type may be implanted into first semiconductor layer by an unmasked ion implantation process. Thereby, a lithographic mask process for fabricating the buried semiconductor layer will become obsolete. In some other embodiments, the dopants may be implanted by a masked ion implantation process, thereby achieving sections of the buried semiconductor layer spaced apart from one another.

Figure 4C:
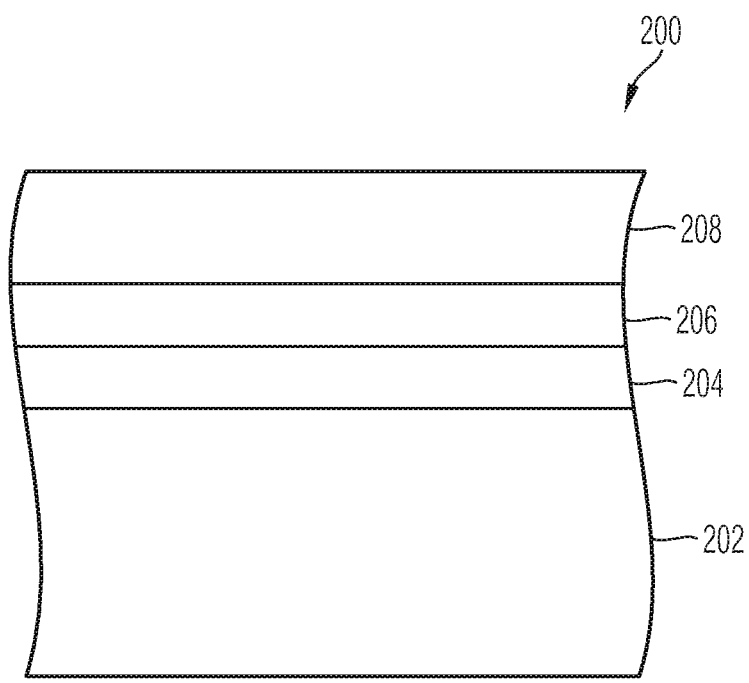

Referring to the schematic cross-sectional view of FIG. 4C, a second semiconductor layer 208 of the second conductivity type is formed on the first semiconductor layer 204, wherein the implanted dopants 205 constitute a buried semiconductor layer 206 arranged between the first and second semiconductor layers 204, 208. The implanted dopants 205 may be activated by thermal heating. A thermal budget during processing of the semiconductor device may determine a vertical outdiffusion profile of the implanted dopants 205, or, in other words, a vertical extension of the buried semiconductor layer. Details provided with regard to parameters of the $n^+$-doped buried semiconductor layer 106 and the n-doped second semiconductor layer 108 described above with reference to FIGS. 1 to 3, for example doping concentration values and profiles, apply likewise with respect to the embodiment illustrated in FIGS. 4A to 4F.

Figure 4D:
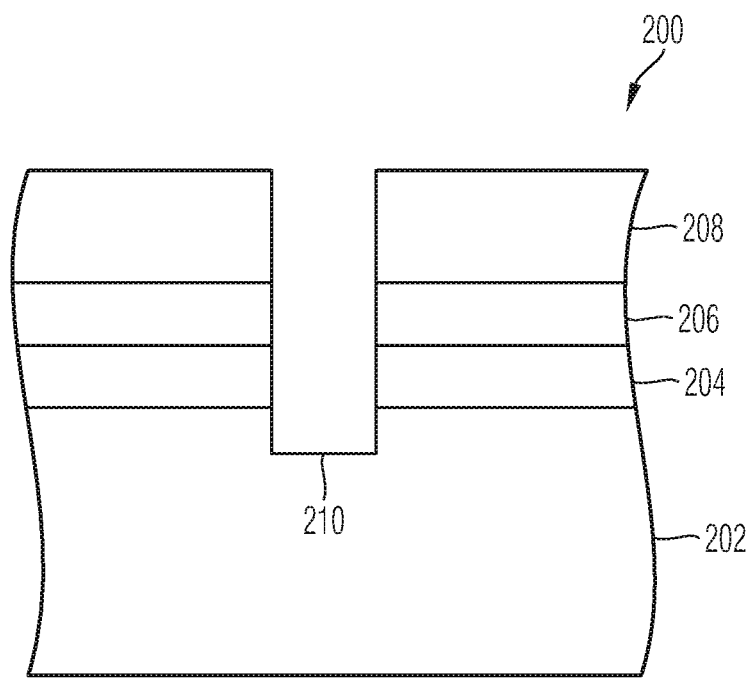

Referring to the schematic cross-sectional view of FIG. 4D, a trench 210 is formed, for example by a masked etch process such as reactive ion etching (RIE) and extends through the second semiconductor layer 208, through the buried semiconductor layer 206, through the first semiconductor layer 204, and into the semiconductor substrate 202.

Figure 4E:
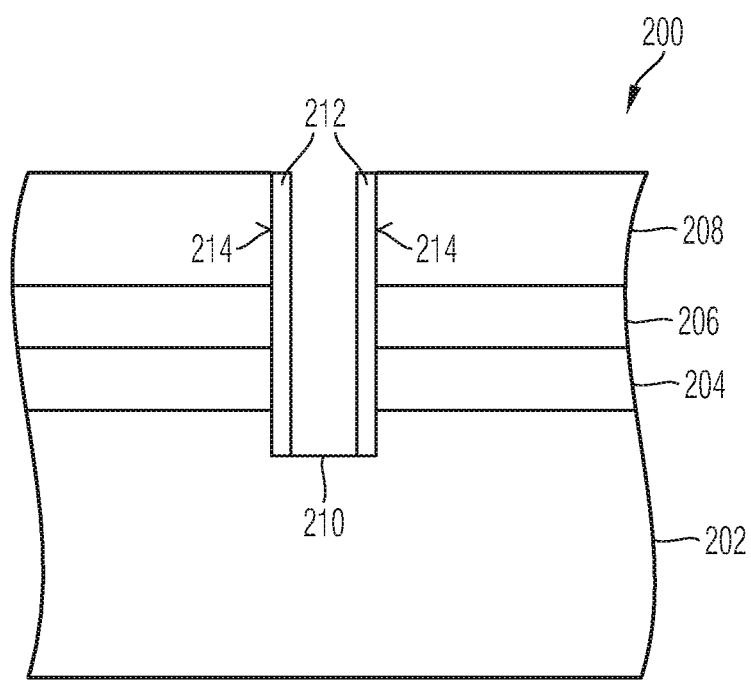

Referring to the schematic cross-sectional view of FIG. 4E, an insulating structure 212 is formed in the trench 210 and lines walls 214 of the trench 210. Formation of the insulating structure 212 may include a layer deposition process and/or a thermal oxidation process followed by an etch process, for example an anisotropic etch process for removing material of the insulating structure from a top side of the second semiconductor layer 208 and from a bottom of the trench 210, thereby exposing the semiconductor substrate 202 at the bottom of the trench 210. Details provided with regard to parameters of the insulating structure 121 described above with reference to FIGS. 1 to 3, for example materials and material combinations, apply likewise to the embodiment illustrated in FIGS. 4A to 4F.

Figure 4F:
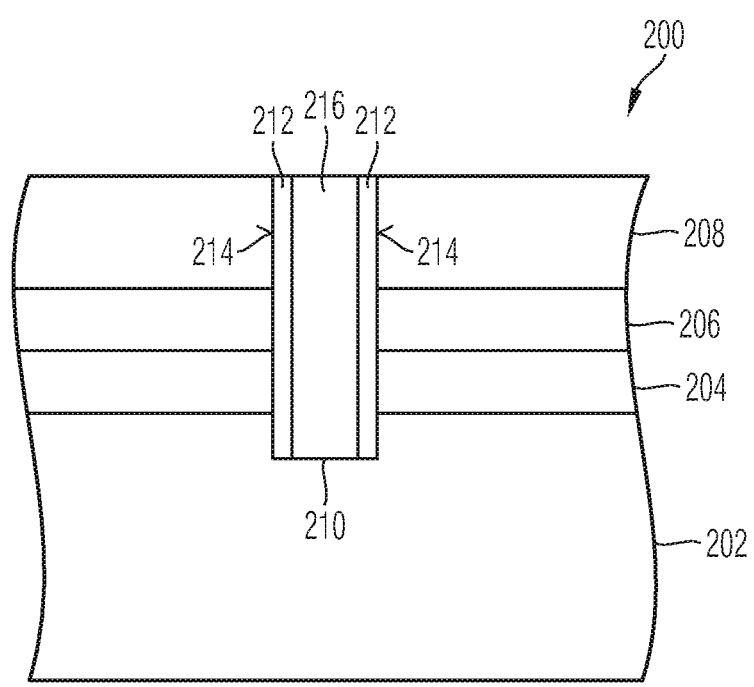

Referring to the schematic cross-sectional view of FIG. 4F, a conductive filling 216 is filled in the trench and is electrically coupled to the semiconductor substrate at a bottom of the trench, for example by a direct contact to the semiconductor substrate 202 or via a contact promotion layer as is illustrated in FIG. 1, for example. Formation of the conductive filling 216 may include a layer deposition process, for example CVD of highly doped polycrystalline silicon and/or deposition of metal, and an etch process for removing material of the conductive filling 216 from a top side of the second semiconductor layer 208. Details provided with regard to parameters of the conductive filling 216 described above with reference to FIGS. 1 to 3, for example materials and material combinations, apply likewise with respect to the embodiment illustrated in FIGS. 4A to 4F.

Further processes may follow, for example processes to integrate circuit elements in the second semiconductor layer 208, for example.

It will be appreciated that while method 1000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor substrate of a first conductivity type;
a first semiconductor layer of a second conductivity type on the semiconductor substrate;
a buried semiconductor layer of the second conductivity type on the first semiconductor layer;
a second semiconductor layer of the second conductivity type on the buried semiconductor layer;
a trench extending through each of the second semiconductor layer, the buried semiconductor layer, and the first semiconductor layer, and into the semiconductor substrate;
an insulating structure lining walls of the trench; and
a conductive filling in the trench, the conductive filling being electrically coupled to the semiconductor substrate at a bottom of the trench,
wherein a concentration profile of first conductivity type dopants of the semiconductor substrate decreases along a vertical direction from the semiconductor substrate to the buried semiconductor layer,
wherein a doping concentration of the first conductivity type dopants of the semiconductor substrate at a depth of a maximum doping concentration of the buried semiconductor layer is smaller than $10^{14}$ cm$^{-3}$.

2. The semiconductor device of claim 1, wherein a doping concentration profile of the buried semiconductor layer is an ion implantation profile in a depth direction into the semiconductor substrate.

3. The semiconductor device of claim 1, wherein a vertical distance between a maximum of a doping concentration profile of the buried semiconductor layer and a pn junction between the first semiconductor layer and the semiconductor substrate is in a range from 10 µm to 30 µm.

4. The semiconductor device of claim 1, wherein a maximum doping concentration of the buried semiconductor layer is in a range from $5\times10^{18}$ cm$^{-3}$ and $5\times10^{20}$ cm$^{-3}$.

5. The semiconductor device of claim 1, further comprising a kink point in a doping concentration profile at a boundary between the buried semiconductor layer and the first semiconductor layer, wherein a vertical extension of the first semiconductor layer between the kink point and a pn junction between the first semiconductor layer and the semiconductor substrate is in a range from 5 µm to 25 µm.

6. The semiconductor device of claim 1, wherein the buried semiconductor layer includes phosphorus and arsenic dopants.

7. The semiconductor device of claim 1, wherein a doping concentration profile of the first semiconductor layer is an in-situ doped concentration profile in a depth direction into the semiconductor substrate.

8. The semiconductor device of claim 1, wherein along a vertical extension from the buried semiconductor layer to a pn junction between the first semiconductor layer and the semiconductor substrate, the first semiconductor layer has a dose of doping in a range from $10^{11}$ cm$^{-2}$ to $10^{13}$ cm$^{-2}$.

9. The semiconductor device of claim 8, wherein the dose of doping is configured to set a breakdown voltage of the pn junction between the first semiconductor layer and the semiconductor substrate in a range from 120V to 200V.

10. The semiconductor device of claim 1, wherein a doping concentration of the first semiconductor layer is constant along at least 50% of a vertical extension from the buried semiconductor layer to a pn junction between the first semiconductor layer and the semiconductor substrate.

11. The semiconductor device of claim 1, wherein a doping concentration profile of the first semiconductor layer includes at least two plateaus.

12. The semiconductor device of claim 11, wherein a first one of the at least two plateaus is closer to the semiconductor substrate than a second one of the at least two plateaus, and wherein a doping concentration at the first plateau is smaller than a doping concentration at the second plateau.

13. The semiconductor device of claim 1, further comprising a plurality of the trenches and a plurality of semiconductor circuit elements formed in different sections of the second semiconductor layer, wherein the plurality of trenches is configured to electrically isolate neighboring sections of the second semiconductor layer that are separated by one of the plurality of trenches.

14. The semiconductor device of claim 13, wherein the plurality of semiconductor circuit elements includes a combination of bipolar circuit elements, CMOS circuit elements and DMOS circuit elements.

15. A semiconductor device, comprising:
a semiconductor substrate of a first conductivity type;
a first semiconductor layer of a second conductivity type on the semiconductor substrate;
a buried semiconductor layer of the second conductivity type on the first semiconductor layer;

a second semiconductor layer of the second conductivity type on the buried semiconductor layer;

a trench extending through each of the second semiconductor layer, the buried semiconductor layer, and the first semiconductor layer, and into the semiconductor substrate;

an insulating structure lining walls of the trench; and a conductive filling in the trench, the conductive filling being electrically coupled to the semiconductor substrate at a bottom of the trench, wherein along a vertical extension from the buried semiconductor layer to a pn junction between the first semiconductor layer and the semiconductor substrate, the first semiconductor layer has a dose of doping in a range from $10^{11}$ cm$^{-2}$ to $10^{13}$ cm$^{-2}$, wherein the dose of doping is configured to set a breakdown voltage of the pn junction between the first semiconductor layer and the semiconductor substrate in a range from 120V to 200V.

16. A semiconductor device, comprising:

a semiconductor substrate of a first conductivity type;

a first semiconductor layer of a second conductivity type on the semiconductor substrate;

a buried semiconductor layer of the second conductivity type on the first semiconductor layer;

a second semiconductor layer of the second conductivity type on the buried semiconductor layer;

a trench extending through each of the second semiconductor layer, the buried semiconductor layer, and the first semiconductor layer, and into the semiconductor substrate;

an insulating structure lining walls of the trench; and a conductive filling in the trench, the conductive filling being electrically coupled to the semiconductor substrate at a bottom of the trench, wherein a doping concentration profile of the first semiconductor layer includes at least two plateaus.

17. The semiconductor device of claim 16, wherein a first one of the at least two plateaus is closer to the semiconductor substrate than a second one of the at least two plateaus, and wherein a doping concentration at the first plateau is smaller than a doping concentration at the second plateau.

* * * * *